US012592561B2

(12) United States Patent
Pumberger et al.

(10) Patent No.: US 12,592,561 B2
(45) Date of Patent: Mar. 31, 2026

(54) MULTICHANNEL TEST SYSTEM WITH GALVANIC COUPLING OF INTERMEDIATE CIRCUITS, AND METHOD FOR GALVANICALLY COUPLING INTERMEDIATE CIRCUITS

(71) Applicant: AVL List GmbH, Graz (AT)

(72) Inventors: Michael Pumberger, Graz (AT); Oliver König, Graz (AT); Manfred Seidl, Mühldorf (AT); Johannes Ornig, Graz (AT)

(73) Assignee: AVL List GmbH, Graz (AT)

( * ) Notice: Subject to any disclaimer, the term of this patent is extended or adjusted under 35 U.S.C. 154(b) by 181 days.

(21) Appl. No.: 18/711,123

(22) PCT Filed: Nov. 18, 2022

(86) PCT No.: PCT/AT2022/060403
§ 371 (c)(1),
(2) Date: May 17, 2024

(87) PCT Pub. No.: WO2023/087044
PCT Pub. Date: May 25, 2023

(65) Prior Publication Data
US 2025/0015594 A1      Jan. 9, 2025

(30) Foreign Application Priority Data
Nov. 19, 2021    (AT) ............................... A 50928/2021

(51) Int. Cl.
*G01R 1/30*       (2006.01)
*G01R 31/40*      (2020.01)
*H02J 3/24*       (2006.01)
(52) U.S. Cl.
CPC .................. *H02J 3/24* (2013.01); *G01R 1/30* (2013.01); *G01R 31/40* (2013.01)

(58) Field of Classification Search
None
See application file for complete search history.

(56) References Cited

U.S. PATENT DOCUMENTS

2015/0277461 A1* 10/2015 Anderson ................. H02J 1/14
                                                    307/32
2018/0062514 A1*  3/2018 Dong .................... H02M 3/158
                    (Continued)

FOREIGN PATENT DOCUMENTS

DE       102013226603        6/2015
DE       102014224686        6/2016
                    (Continued)

OTHER PUBLICATIONS

Internationaler Recherchenbericht und Schriftlicher Bescheid [International Search Report and the Written Opinion] Dated Mar. 31, 2023 From the International Searching Authority Re. Application No. PCT/AT2022/060403 and Its Translation of Search Report Into English. (11 Pages).

*Primary Examiner* — Jermele M Hollington

(57) ABSTRACT

The present invention relates to a multichannel test system (100) and to a method for supplying test load devices (61, 62) with electrical power from a supply grid, comprising at least a first test channel (10) and a second test channel (20) which are galvanically separated. At least one switching device (40) is provided for galvanically coupling intermediate circuits (13, 23) of the test channels (10, 20) in a switchable manner to form a common intermediate circuit. For this purpose, in addition to phase-controlled, variably adjustable rectification, uncontrolled, invariable rectification is also provided in a passive operating mode by an active power stage (12, 22) in power converter circuits (16, 26, 36) of the test channels (10, 20, 30).

15 Claims, 2 Drawing Sheets

(56)        References Cited

U.S. PATENT DOCUMENTS

2020/0176994  A1      6/2020   Hinterberger et al.
2025/0138106  A1*    5/2025   Schmidt ................ G01R 31/40

FOREIGN PATENT DOCUMENTS

EP          2586646      5/2013
WO     WO 2013/104409     7/2013
WO     WO 2014/026840     2/2014
WO     WO-2019126839  A1 *   7/2019    .............. H02J 1/082

* cited by examiner

MULTICHANNEL TEST SYSTEM WITH GALVANIC COUPLING OF INTERMEDIATE CIRCUITS, AND METHOD FOR GALVANICALLY COUPLING INTERMEDIATE CIRCUITS

RELATED APPLICATIONS

This application is a National Phase of PCT Patent Application No. PCT/AT2022/060403 having International filing date of Nov. 18, 2022, which claims the benefit of priority of Austria Patent Application No. A 50928/2021 filed on Nov. 19, 2021. The contents of the above applications are all incorporated by reference as if fully set forth herein in their entirety.

FIELD AND BACKGROUND OF THE INVENTION

The present invention relates to multichannel test systems and to a method for supplying test load devices with electrical power from a supply grid, which test load devices comprise a coupling of DC-carrying intermediate circuits consisting of galvanically separated test channels.

Multichannel test systems of this kind are used, for example, in the development and stationary testing or checking of electric drive systems or electric on-board systems of vehicles, in which a plurality of interacting electrical assemblies, in particular loads and storage devices, for example traction motors and traction batteries as well as auxiliary units for air conditioning or the like, are fed with electrical power from a supply network in test runs on a test bench. Test systems having a plurality of channels offer greater flexibility, since they allow for individual power supply with a configurable voltage as needed for various test specimens on the test bench in parallel via a plurality of channel outputs. An individually adjustable or open-loop controllable voltage conversion between an AC voltage of the grid and a DC voltage or DC current for a connected load takes place in the respective channels.

Corresponding multichannel test systems are known in the circuitry of which galvanic separation between the channels is provided, more precisely from an individual power stage of each channel. In other words, power transformation from the grid to the channel or from the channel back into the grid takes place in each channel via a separate power rectifier, wherein the power rectifiers of all channels are connected to the grid coupled via a transformer.

The galvanic separation has the advantage that supply stability of power parameters of a channel output are not influenced by fluctuations in power flows in parallel test channels. This applies, in particular, to the measurement of the insulation resistance to earth, which is sensitive to adjacent power fluctuations. An output stage that is individually configurable for the load and that is generally fed by a constant DC current from a DC voltage intermediate circuit generated after the power transformation is connected downstream in the region of the channel output. However, the advantage of supply stability also goes hand in hand with the disadvantage of a limited power capacity of each channel, which is defined by a proportion of a total capacity of the shared transformer provided for each of the parallel channels.

Furthermore, multichannel test systems are known in the circuitry of which a channel may comprise a plurality of channel outputs. In a central portion of the channel, an intermediate circuit is provided which carries a constant DC current at a constant DC voltage of, for example, 820 V or 1250 V, which is fed from the power transformation of the power rectifier. The intermediate circuit connects the power rectifier to the channel outputs of the channel, wherein the individual output stages of the channel outputs are supplied with DC current from the power rectifier jointly from the intermediate circuit, i.e. galvanically coupled.

The configuration of a galvanically coupled supply of a plurality of channel outputs via a common intermediate circuit of the channel has the advantage that a power flow is possible between the loads connected to the channel outputs of the same channel. In the case where a load is a storage device, i.e. can output power as well as consume same, it is possible to temporarily supply a high-power load with a peak power that exceeds the capacity of the power transformation of the channel from the grid or a grid connection power of the transformer. However, this advantageous capacity increase for a connected load with pronounced power peaks is only useful with the above-mentioned constellation of a storage device among the connected loads as well as further variable conditions such as a storage state and capacity as well as temporary dependencies.

At least in theory, the goal of increasing the maximum grid connection power that can be provided to a high-power load at a channel output would also conceivably include further configuration of a test system, for which, according to the applicant's knowledge, no practical implementation has yet become known. Thus, in theory, two single-channel test devices could be interconnected via the intermediate circuits thereof, from which an output stage or output stages connected in parallel for the high-power load are fed. However, coupling of two mains-fed intermediate circuits would cause damagingly high equalising currents even at low voltage differences in the range of measurement and control errors (e.g. 0.25% at a voltage of 1200 V). The problem can only be addressed at great expense and with significant technical effort, for example with a contactor switch with high current-carrying capacity in conjunction with improved control technology and more precise measurement technology for synchronising the power transformations that feed the intermediate circuits in parallel, as well as considerable equalisation periods during each coupling process in order to limit the equalising current.

SUMMARY OF THE INVENTION

An object of the invention is to overcome the above-mentioned disadvantages of test systems in the prior art. Another object of the invention is to provide a test system of the like mentioned at the outset that allows for high flexibility with the parallel provision of an individually configurable power supply to various loads on a test bench as well as a high capacity of the grid connection power and of the power transformation for individual high-power loads. Another object of the present invention is to keep the time needed for operating the test system short when switching between the provided configurations by virtue of the technical features.

The objects presented above are achieved by means of a multichannel test system for supplying test load devices having the features of claim 1 and a method for supplying test load devices having the steps of claim 9. Other features and details of the invention are apparent from the dependent claims, the description and the drawings. Features and details that are described in connection with the multichannel test system according to the invention naturally also apply in connection with the method according to the invention and vice versa, and therefore reference is or can be made interchangeably to the disclosure of the individual aspects of the invention.

According to the invention, a multichannel test system is provided for supplying test load devices with electrical power from a supply grid. The multichannel test system comprises at least a first test channel and a second test channel which each comprise at least one channel output for providing a power with a predetermined output voltage to test load devices. Each of the test channels is galvanically separated and comprises a controllable power converter circuit and an intermediate circuit as well as one or more channel outputs. The controllable power converter circuit is used to convert electrical power between the supply grid and the DC-carrying intermediate circuit of the test channel in a controlled manner. Each channel output comprises an output stage which is connected to the intermediate circuit in order to convert a DC voltage between the intermediate circuit and the predetermined output voltage of the channel output. The multichannel test system further comprises a switching device which is connected at least to the intermediate circuits of the first test channel and second test channel, and which is provided for galvanically coupling the intermediate circuits in a switchable manner to form a common intermediate circuit and for galvanically separating the intermediate circuits in a switchable manner. In addition, the controllable power converter circuits at least of the first test channel and second test channel comprise an active power stage which is configured to provide phase-controlled, variably adjustable rectification in an active operating mode as well as uncontrolled, invariable rectification in a passive operating mode.

Similarly, according to the invention, a method is provided for supplying test load devices with electrical power from a supply grid by means of a multichannel test system having at least two galvanically separated test channels. One step of the method consists in converting an AC voltage between the supply grid and each test channel by means of a transformer in each test channel. A further step of the method consists in rectifying the AC voltage between the transformer and a DC-carrying intermediate circuit by means of an active power stage in each test channel, wherein the rectification can be transferred between a phase-controlled, variably adjustable rectification by means of an active operating mode and an uncontrolled, invariable rectification by means of a passive operating mode of the active power stage. A further step of the method consists in converting a DC voltage between the DC-carrying intermediate circuit and a predetermined output voltage for test load devices by means of at least one output stage in each test channel. A further step of the method consists in galvanically coupling intermediate circuits of at least two test channels to form a common intermediate circuit or galvanically separating the intermediate circuits by means of a switching device, provided that the rectification in the active power stages of the at least two test channels was firstly transferred to uncontrolled, invariable rectification by means of the passive operating mode.

The present invention thus provides, for the first time, a circuit architecture for a multichannel test system with switchable coupling and separation of intermediate circuits consisting of galvanically separated test channels. The present invention in particular provides a circuit architecture of this kind with galvanically separated transformers. For this purpose, the present invention proposes, for the first time, technical prerequisites and a mode of operation for simplified handling of the switchable coupling and separation of intermediate circuits.

An advantage of the invention lies in the flexible configuration, which is made possible by the multichannel test system. If only one output stage for one channel output is supplied by each test channel in conjunction with a load, said load is galvanically isolated and is not influenced by power fluctuations in other test channels. Thus, the test channels of the multichannel test system according to the invention can be operated in the context of and with the specific advantages of multiple single-channel test devices. In test operation applications, in which galvanic isolation is irrelevant, power balancing between output stages of channel outputs can occur in conjunction with loads of different kinds directly via the intermediate circuit, without power transformation to the supply grid.

A further advantage of the invention lies in the flexible increase in the power capacity that can be provided for an individual load by switchably combining all components from two galvanically separated test channels. In the case of galvanic coupling of the intermediate circuits of two test channels of this kind, a common intermediate circuit is fed with the combined capacities from an available grid connection power from two or more transformers and an available power transformation from two or more power converter circuits. As a result, one or more output stages which are connected in parallel and which are connected to a high-power load, for example an electric traction drive, are fed with a high reserve of power capacity, wherein large power fluctuations can also be covered simply via the grid connection of the multichannel test system. In other words, a channel output is no longer restricted by the associated power capacity of the channel in a multichannel test system or the power of a transformer in a single-channel test device.

A further advantage consists in practical handling and rapid modification between single-channel and multichannel circuit configurations of the test system for different test operations. One aspect of the present invention is based on the knowledge that it is possible to achieve a very good approximation of intermediate circuit voltages and thus a low equalising potential in passive operation of the power rectifiers for the power transformation in the power converter circuits or the active power stages thereof. This is because, after the power rectifiers are stopped, the initially closed-loop controlled intermediate circuit voltage assumes a passive rectification value which is set in an equilibrium between the circuit components during passive, uncontrolled rectification in the sense of a diode. This passive mode is desired after an active mode of a closed-loop controller of a closed-loop controlled power rectifier and is achieved quickly by actively lowering the actually constant intermediate circuit voltage to a passive value and then stopping the closed-loop control. Consequently, in practice, no waiting time is required in order to achieve the passive mode by means of self-discharge of the intermediate circuit.

Due to the common grid voltage, the deviation between the intermediate circuit voltages at this point of operation can only be influenced by winding ratios of coils of the transformers. With the same component types and properties between the channels, there is thus only a minimal deviation between the voltages that is less than that which would be achievable between closed-loop controlled voltages with greater closed-loop control and measurement effort during active operation.

Accordingly, an equalising current can be kept small, i.e. without a pre-charge circuit which protects the contactor against high currents during the switching process. In addition, a significant time saving is achieved, since, due to the active lowering of the voltage in the passive mode, no waiting time is required to allow the intermediate circuit to discharge itself. Thus, in practice, the entire process can be shortened from several minutes to a few seconds. In summary, the provision of passive, uncontrolled rectification, i.e. both the provision of a corresponding operating mode in a power converter circuit or an active power stage, included therein, of the multichannel test system according to the invention and also the establishment of a corresponding condition and temporary use of the mode of operation in the method according to the invention, implies a significant time advantage when modifying the test system between single-channel and multichannel circuit configurations. In other words, the provision of passive, uncontrolled rectification allows for the above-mentioned modification by means of an operation-friendly switching process with low closed-loop control and measurement effort.

In one embodiment, the controllable power converter circuits of the galvanically separated test channels comprise an upstream transformer and a downstream active power stage. The transformer, which is connected to the supply grid, is used to convert an AC voltage between the supply grid and the test channel. The active power stage, which is connected to the transformer, is used to rectify the AC voltage between the transformer and the DC-carrying intermediate circuit, and provides the active operating mode for phase-controlled, variably adjustable rectification as well as the passive operating mode for uncontrolled, invariable rectification.

In an alternative embodiment, the controllable power converter circuits of the galvanically separated test channels comprise an upstream active power stage and a downstream closed-loop intermediate circuit voltage controller. The active power stage, which is connected to the supply grid, is used to convert an AC voltage between the supply grid and the test channel, and provides the active operating mode for phase-controlled, variably adjustable rectification as well as the passive operating mode for uncontrolled, invariable rectification. The closed-loop intermediate circuit voltage controller, which is connected to the active power stage (12, 22, 32), is used for controlled conversion of an AC voltage between the active power stage and the DC-carrying intermediate circuit.

In an advantageous embodiment of the present invention, the multichannel test system further comprises a control unit which is configured to switch a galvanic coupling or separation of intermediate circuits by means of the switching device or to provide circuit actuation when, in the active power stages of the relevant test channels, rectification has been transferred to the passive operating mode.

In another advantageous embodiment of the present invention, the multichannel test system additionally comprises voltage sensors for detecting a voltage of intermediate circuits; wherein the control unit is further configured to switch a galvanic coupling or separation of intermediate circuits by means of the switching device or to provide circuit actuation when the voltages in the intermediate circuits reach a respective or a common predetermined threshold value $S_U$.

According to an advantageous aspect of the present invention, the respective or common threshold value $S_U$ is predetermined in relation to achieving a passive voltage level of the respective intermediate circuit, which threshold value is set in an equilibrium of the voltage conversions of the respective test channel in the passive operating mode of the rectification itself.

In an advantageous embodiment of the present invention, at least the first test channel and second test channel in each case comprise a transformer and an active power stage with the same conversion properties, as a result of which a substantially equal passive voltage level is set in the respective intermediate circuits, and wherein a common threshold value $S_U$ in relation to achieving the passive voltage level is predetermined.

In an advantageous embodiment of the present invention, the multichannel test system additionally comprises a timer for specifying a predetermined length of time; wherein the control unit is further configured to transfer the rectification from the passive operating mode back to the active operating mode or to release transfer actuation when a specified length of time has elapsed upon completion of a switching process for galvanically coupling or separating intermediate circuits.

According to one aspect of the present invention, the control unit is further configured to switch a galvanic coupling or separation of the intermediate circuits by means of the switching device or to provide switching actuation when a supply of all test load devices from an associated intermediate circuit has been interrupted.

In an advantageous embodiment of the present invention, each output stage comprises a disconnector which is provided for switchably disconnecting the channel output from the associated intermediate circuit or for switchably disconnecting the channel output from an associated test load device; and the control unit is further configured to switch a disconnection of at least those channel outputs which are connected to a test load device by means of the disconnectors or to provide circuit actuation.

BRIEF DESCRIPTION OF SPECIFIC EMBODIMENTS OF THE INVENTION

Additional advantages, features and details of the invention are apparent from the following description, in which exemplary embodiments of the invention are described in detail with reference to the drawing. The features mentioned in the claims and in the description may be essential to the invention individually or in any combination.

DESCRIPTION OF SPECIFIC EMBODIMENTS OF THE INVENTION

Figure 1:
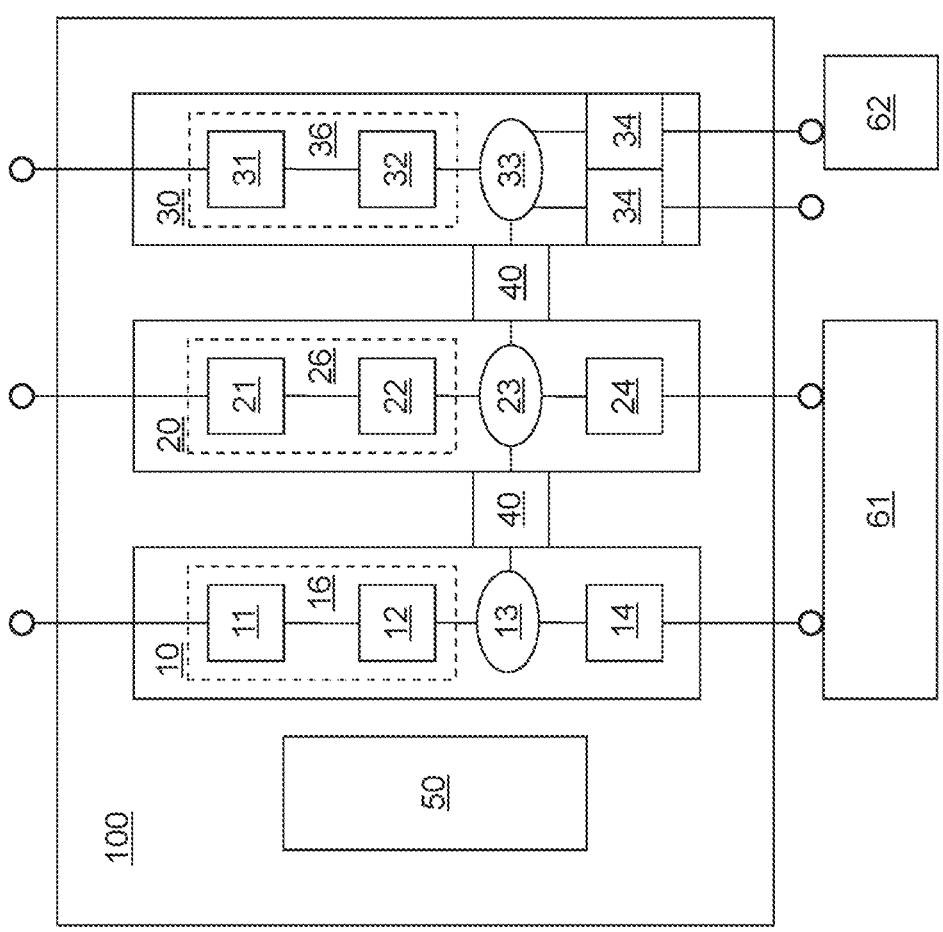
FIG. 1 is a block diagram showing a circuit of components of the multichannel test system according to a first embodiment of the invention.

In FIG. 1, a first embodiment according to the invention of a multichannel test system 100 having three parallel test channels 10, 20, 30 is schematically sketched in a block diagram. The multichannel test system 100 is used to supply test load devices 61, 62 with electrical power from a supply grid (not shown). For this purpose, the multichannel test system 100 comprises grid connections which are shown schematically at the top. At the bottom, channel outputs are shown, which are connected individually or in parallel to the various test load devices 61, 62 in different configurations.

The test load devices 61, 62 may be components of an electric drive system on a test bench that is subjected to various test runs. The test load devices 61, 62 may be of different types, for example an electric motor or a battery. In the exemplary embodiment shown, the test load devices 61 is a relatively high-power traction motor that is supplied with power from the two test channels 10 and 20, and the test load devices 62 is a smaller electric motor that represents, for example, a compressor or an air conditioning unit. At the relevant channel output, the test channels 10 and 20 not only carry a different power, but also a different, higher output voltage or required operating voltage at the test load devices 61 than the test channel 30 at the test load devices 62. The power parameters such as the output voltage are individually configurable using the test channels 10, 20, 30.

The circuit of the test channel 10 comprises, in a section on the cable input side, a controllable power converter circuit (16), which consists of an upstream transformer 11 and a downstream active power stage in this first embodiment. The transformer 11 is an AC/AC converter that is connected to the supply grid via the grid connection. The transformer 11 converts an AC voltage of the grid voltage into a system voltage and supplies the active power stage 12. The active power stage 12 is a controllable AC/DC converter which converts the AC voltage of the system voltage into a DC voltage of a DC current and feeds an intermediate circuit 13 of the test channel 10. The active power stage 12 has a closed-loop controlled power rectifier (MR) which assumes the function of an AC/DC converter. Furthermore, it also has phase-controlled rectification with variable power transformation, which generates a required or needs-based power for the intermediate circuit at a predeterminable closed-loop controlled voltage. Furthermore, the closed-loop controlled power rectifier has two operating modes and a large number of intermediate transition operating states with regard to a mode of operation of the rectification from AC voltage to DC voltage. In an active operating state of the active power stage 12, the closed-loop controlled power rectifier carries out the above-described, phase-controlled rectification with variable power transformation. In a passive operating state of the active power stage 12, the closed-loop controlled power rectifier carries out uncontrolled rectification, which corresponds to the function and mode of operation of a passive circuit having a diode. An output stage 14 is supplied from the intermediate circuit 13. The output stage 14 is, in particular, a step-down converter (STDC) which converts the voltage fed from the active power stage 12 to the intermediate circuit 13 into a specific or individually predetermined output voltage of the relevant channel output for the test load devices 61 connected thereto.

In the embodiment of the invention, the test channel 20 corresponds to the test channel 10 and not only has the same schematic circuit design, but also the same components and conversion properties in terms of identical component typing of the transformer 21, the active power stage 22 or the closed-loop controlled power rectifier included therein, and optionally also the output stage 24, with regard to the channel assignment of the exemplary embodiment illustrated. In the embodiment of the invention, the test channel 30 also corresponds to the test channel 10 in terms of an identical component typing of the transformer 31, the active power stage 32 or the closed-loop controlled power rectifier included therein. In the exemplary embodiment of the channel assignment shown, for the purpose of showing configuration possibilities, the test channel 30 differs from the test channels 10 and 20 in that it optionally comprises two channel outputs with one associated output stage 34 in each case, of which one is unassigned and one is connected to the test load device 62. Both output stages 34 that are optionally configurable in different output voltages are supplied from the same intermediate circuit 33 of the test channel 30. The three test channels 10, 20, 30 are galvanically separated, i.e. in particular all DC-carrying components of the circuit of each test channel 10, 20, 30, and in the present embodiment also the transformers 11, 21, 31, are routed in parallel to one another without cross-influences.

The multichannel test system 100 further comprises a switching device 40 which is connected to the intermediate circuit 13 of the first test channel 10, the intermediate circuit 23 of the first test channel 20 and the intermediate circuit 33 of the first test channel 30. On account of different circuit positions of the switching device 40, the intermediate circuit 13 and the intermediate circuit 23, or the intermediate circuit 23 and the intermediate circuit 33, or the intermediate circuit 13 and the intermediate circuit 33, or all three intermediate circuits 13, 23, 33 can be combined, i.e. galvanically coupled, to form a common intermediate circuit. The switching device 40 is realised in the form of a contactor or contactor switch.

A common intermediate circuit coupled in this manner in a combination of two or three test channels 10, 20, 30 has the result that the channel outputs or the output stages 14, 24, 34 thereof are galvanically coupled to one another, i.e. power distribution with an equalising power flow between the test channels 10, 20, 30 takes place via the common intermediate circuit. However, a common intermediate circuit coupled in this manner allows for a doubling or tripling of a power capacity that can be drawn from the supply grid and that is available on the output side for one of the test load devices 61, 62, without a new circuit design of the test system 100 in principle having to be set up or without the need for a larger transformer to modify the test system 100.

In the channel assignment of the exemplary embodiment shown in FIG. 1, the test load devices 61 constitutes a high-power load such as a traction motor for which sufficient power reserves are to be provided in test operation under full load. Accordingly, in the exemplary embodiment shown, the intermediate circuits 13 and 23 are connected together via the switching device 40 to form a common intermediate circuit. As a result, the output stages 14 and 24 or the channel outputs of the test channels 10 and 20, which together supply a power at the test load device 61, are galvanically coupled. In the exemplary embodiment shown, however, the intermediate circuit 33 of the test channel 30 has not been coupled by means of the switching device 40, and therefore the two output stages 34 remain galvanically coupled to one another, but remain galvanically separated from the output stages 14, 24 and remain unaffected by the high power flows through the test channels 10 and 20.

Unlike in FIG. 1, only one channel output of the test channel 10 or of the test channel 20 can be connected to the test load device 61 in a functionally equivalent circuit.

Furthermore, the multichannel test system 100 comprises a control unit 50, which is used to control, i.e., within the context of the present disclosure, to control in an open loop and/or closed loop manner, the switching processes of the switching device 40 as well as the previously described modes of operation of the rectification of the closed-loop controlled power rectifier in the controllable power converter circuits (16, 26, 36), i.e. more precisely in the active power stages 12, 22, 32 of the controllable power converter circuits (16, 26, 36). For this purpose, the control unit 50 can be actuated preferably via an operating interface to affect changes to the circuit configuration, in particular to carry out couplings and separations of the intermediate circuits 13, 23, 33. For method-related reasons, the present invention further provides that the control unit 50 carries out or releases or permits switching processes of the switching device 40 or external actuation from a user for this purpose under certain conditions, in particular in the previously described passive operating mode of the rectification in the test channels 10, 20, 30 involved.

Figure 2:
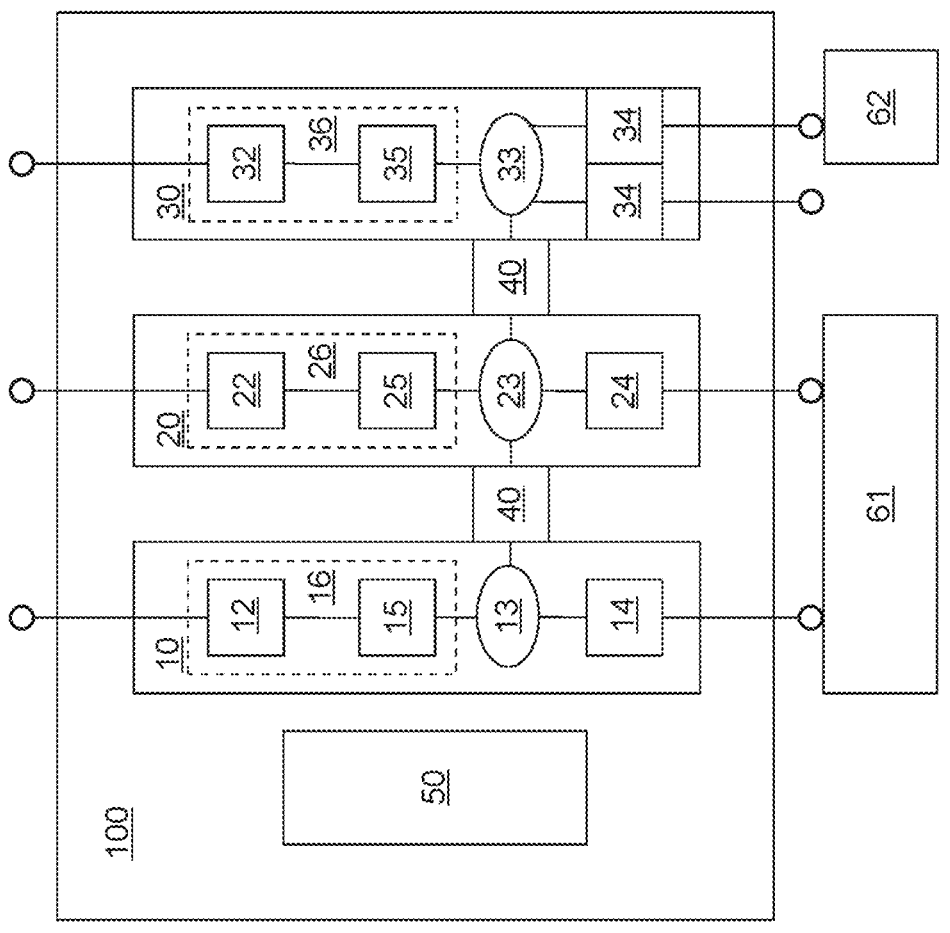
FIG. 2 is a block diagram showing a circuit of components of the multichannel test system according to a second embodiment of the invention.

In FIG. 2, a second embodiment according to the invention of the multichannel test system 100 having three parallel test channels 10, 20, 30 is schematically sketched in a block diagram. The multichannel test system 100 of the second embodiment in FIG. 2 differs from the first embodiment from FIG. 1 only in the structure of the controllable power converter circuits (16, 26, 36). Functionally, in the second embodiment, an AC/DC conversion is first implemented and then a DC/DC conversion downstream, instead of an AC/AC conversion and a downstream AC/DC conversion, as in the first embodiment.

For this purpose, in each test channel (10, 20, 30), the active power stage (12, 22, 32), which is a controllable AC/DC converter, is in each case directly connected to the supply grid (i.e. without an upstream transformer). The active power stage converts an AC voltage of the supply grid into a rectified system voltage and supplies a closed-loop intermediate circuit voltage controller (15, 25, 35). The closed-loop intermediate voltage controller (15, 25, 35) is a galvanically separating DC/DC converter, which converts the DC voltage of the rectified system voltage into a DC voltage of the DC-carrying intermediate circuit (13, 23, 33) of the respective test channel (10, 20, 30). Aside from the differing circuit position of the active power stage (12, 22, 32) in the second embodiment, this embodiment, as in the first embodiment, also has a closed-loop controlled power rectifier (MR), which assumes the function of an AC/DC converter, and has phase-controlled rectification with variable power transformation, which generates a required or needs-based power at a predeterminable closed-loop controlled voltage for the intermediate circuit. Equally, in the second embodiment, the closed-loop controlled power rectifier also has, as in the first embodiment, two operating modes and a large number of intermediate transition operating states with respect to a mode of operation of the rectification from AC voltage to DC voltage. In an active operating state of the active power stage 12, the closed-loop controlled power rectifier carries out the above-described, phase-controlled rectification with variable power transformation. In a passive operating state of the active power stage 12, the closed-loop controlled power rectifier carries out uncontrolled rectification, which corresponds to the function and mode of operation of a passive circuit having a diode.

In the first and second embodiment of the multichannel test system 100 from FIGS. 1 and 2, a check of the operational requirements for a switching process can be supported by further optional measurement-related measures and conditions, as described below. Optionally, however, operation of the multichannel test system 100 according to the invention can be done manually, in particular can be switched, even without the following functions and without the control unit 50, merely by providing suitable actuation elements and adhering to a logic of operating steps.

In order to ensure low and short equalising currents, each switching process of the switching device 40, in particular during coupling, takes place in the switched-off state of the output stages 14, 24, 34 in order to keep the voltages in the intermediate circuits 13, 23, 33 stable. This process can take place manually, for example using provided disconnectors.

The switching processes of the switching device 40 for changing the circuit configuration can be carried out without the multichannel test system 100 being disconnected from the supply grid. From an active operating mode of the rectification, the intermediate circuit voltages are actively lowered almost to a passive rectification value initially by means of the closed-loop controlled power rectifiers of the active power stages 12, 22, 23 of the test channels 10, 20, 30 involved in the coupling. The active lowering can take place relatively quickly, e.g. from 1250 V to 1045 V within a few 100 ms, since this depends on a selected voltage ramp in a closed-loop intermediate circuit voltage control function of the active power stages 12, 22, 32 according to the first embodiment, or using a closed-loop intermediate circuit voltage controller (15, 25, 35) according to the second embodiment. If the closed-loop controlled power rectifiers are then transferred into the passive operating state, there is a brief wait until the closed-loop controlled intermediate circuit voltage has been lowered by means of further passive discharge down to the passive rectification value or a voltage equilibrium.

While the lowering to the passive operating mode of the closed-loop controlled power rectifiers in the power stages 12, 22, 32 when the switching device 40 is being closed ensures that the voltages of the intermediate circuits are exact and steady before closing, the lowering to the passive operating mode when the switching device 40 is disconnected ensures that the active closed-loop control of the power rectifiers in the power stages 12, 22, 32 does not allow cross-currents to flow via the switching device 40, i.e. the contactor, at the moment of opening.

For this purpose, voltage detection can take place at the intermediate circuits 13, 23, 33 manually or on the part of the control unit 50 by means of voltage sensors and a drop of all voltages below a threshold value $S_U$ that is approximated or predefined in relation to the rectification value can be detected. Alternatively, it is possible to wait, manually or on the part of the control unit 50, for a predefined length of time after which the desired voltage approximation can be assumed.

After a switching process of the switching device 40, the closed-loop controlled power rectifiers of the active power stages 12, 22, 32 of the test channels 10, 20, 30 involved in the coupling are transferred from the passive operating state back to the active operating state manually or on the part of the control unit 50. A voltage indicator of the supply grid is tracked during the entire passive operating state. The control unit 50 raises a target value of individual or coupled intermediate circuits 13, 23, 33 and software of the closed-loop controllers of the power rectifiers in the power stages 12, 22, 23 recognises that active power switching is required by comparing the target value and passive value. As a result, a voltage of the common intermediate circuit is increased from the passive rectification value to a predetermined closed-loop controlled voltage which is predefined according to a new configuration of the multichannel test system 100.

As an alternative to the switching processes described, it is possible to disconnect the intermediate circuits if both rectifiers are already switched off.

The galvanic coupling of the intermediate circuits 13, 23, 33 is accompanied by logical coupling of the closed-loop power rectifier control, which allows for operation without dynamic limitations.

Preferably, the switching process of the coupling and separation is specified by the control unit 50, i.e. centrally in the system, and said control unit also takes over the user interaction and open-loop switching or contactor control.

The explanations of the embodiments given above describe the present invention exclusively within the scope of examples. Of course, individual features of the embodiments may be freely combined with one another, provided that this is technically feasible, without departing from the scope of the present invention.

LIST OF REFERENCE SIGNS

10 Test channel
11 Transformer (AC/AC converter)
12 Active power stage (AC/DC converter)
13 Intermediate circuit
14 Output stage
15 Closed-loop intermediate circuit voltage controller (DC/DC converter)
16 Controllable power converter circuit (AC/AC+AC/DC converter or AC/DC+DC/DC converter)
20 Test channel
21 Transformer
22 Active power stage
23 Intermediate circuit
24 Output stage
30 Test channel
31 Transformer
32 Active power stage
33 Intermediate circuit
34 Output stage
40 Switching device
50 Control unit
61 Test load device
62 Test load device
100 Multichannel test system
$S_U$ Threshold value for intermediate circuit voltages
$S_I$ Threshold value for equalising current

The invention claimed is:

1. Multichannel test system for supplying test load devices with electrical power from a supply grid, comprising at least a first test channel and a second test channel which each comprise at least one channel output for providing a power with a predetermined output voltage for test load devices, wherein the test channels are galvanically separated;

and each test channel comprises a power converter circuit for controlled conversion electrical power between the supply grid and a DC-carrying intermediate circuit of the test channel; each channel output comprises an output stage which is connected to the intermediate circuit in order to convert a DC voltage between the intermediate circuit and the predetermined output voltage of the channel output; and at least one switching device which is connected at least to the intermediate circuits of the first test channel and second test channel, and which is provided for galvanically coupling the intermediate circuits in a switchable manner to form a common intermediate circuit and for galvanically separating the intermediate circuits in a switchable manner; wherein at least the power converter circuits of the first test channel and second test channel comprise an active power stage which is configured to provide phase-controlled, variably adjustable rectification of an AC voltage in an active operating mode as well as uncontrolled, invariable rectification in a passive operating mode.

2. Multichannel test system according to claim 1, wherein the controllable power converter circuits of the galvanically separated test channels comprise:

an upstream transformer which is connected to the supply grid to convert an AC voltage between the supply grid and the test channel; and downstream, the active power stage, which is connected to the transformer, for rectifying the AC voltage between the transformer and the DC-carrying intermediate circuit, and which provides the active operating mode for phase-controlled, variably adjustable rectification as well as the passive operating mode for uncontrolled, invariable rectification.

3. Multichannel test system according to claim 1, wherein the controllable power converter circuits of the galvanically separated test channels comprise:

upstream, the active power stage, which is connected to the supply grid, for converting an AC voltage between the supply grid and the test channel; and which provides the active operating mode for phase-controlled, variably adjustable rectification as well as the passive operating mode for uncontrolled, invariable rectification; and a downstream closed-loop intermediate circuit voltage controller, which is connected to the active power stage, for controlled conversion of an AC voltage between the active power stage and the DC-carrying intermediate circuit.

4. Multichannel test system according to claim 1, further comprising a control unit, wherein the control unit is configured to switch galvanic coupling or separation of intermediate circuits by means of the switching device or to provide circuit actuation when, in the active power stages of the relevant test channels, rectification has been transferred to the passive operating mode.

5. Multichannel test system according to claim 4, further comprising voltage sensors for recording a voltage of intermediate circuits; wherein the control unit is further configured to switch galvanic coupling or separation of intermediate circuits by means of the switching device or to provide circuit actuation when the voltages in the intermediate circuits reach a respective or a common predetermined threshold value $S_U$.

6. Multichannel test system according to claim 5, wherein the respective or common threshold value $S_U$ is predetermined in relation to achieving a passive voltage level of the respective intermediate circuit, which threshold value is set in an equilibrium of the voltage conversions of the respective test channel in the passive operating mode of the rectification itself.

7. Multichannel test system according to claim 5, wherein at least the first test channel and second test channel in each case comprise a transformer and an active power stage with the same conversion properties, as a result of which a substantially equal passive voltage level is set in the respective intermediate circuits, and wherein a common threshold value $S_U$ in relation to achieving the passive voltage level is predetermined.

8. Multichannel test system according to claim 1, further comprising a timer for specifying a predetermined length of time; wherein the control unit is further configured to transfer the rectification from the passive operating mode back to the active operating mode or to release transfer actuation when a specified length of time has elapsed upon completion of a switching process for galvanically coupling or separating intermediate circuits.

9. Multichannel test system according to claim 1, wherein the control unit is further configured to switch a galvanic coupling or separation of the intermediate circuits by means of the switching device or to provide switching actuation when a supply of all test load devices from an associated intermediate circuit has been interrupted.

10. Multichannel test system according to claim 1, wherein each output stage comprises a disconnector which is provided for switchably disconnecting the channel output from the associated intermediate circuit or for switchably disconnecting the channel output from an associated test load device.

11. Method for supplying test load devices with electrical power from a supply grid by means of a multichannel test system having at least two galvanically separated test channels, comprising the steps of:

converting electrical power between the supply grid and a DC-carrying intermediate circuit of each test channel by means of a power converter circuit; including the intermediate steps of:

rectifying the AC voltage between a transformer and a DC-carrying intermediate circuit or rectifying the AC voltage between the supply grid and a closed-loop intermediate circuit voltage controller by means of an active power stage in each test channel;

wherein the rectification can be transferred between a phase-controlled, variably adjustable rectification by means of an active operating mode and an uncontrolled invariable rectification by means of a passive operating mode of the active power stage;

converting a DC voltage between the DC-carrying intermediate circuit, and a predetermined output voltage for test load devices by means of at least one output stage in each test channel; and galvanically coupling intermediate circuits of at least two test channels to form a common intermediate circuit or galvanically separating the intermediate circuits by means of a switching device when the rectification in the active power stages of the at least two test channels was transferred to uncontrolled, invariable rectification by means of the passive operating mode.

12. Method according to claim 11, further comprising the intermediate step of:

detecting a voltage of intermediate circuits by means of voltage sensors; and galvanically coupling intermediate circuits of at least two test channels to form a common intermediate circuit or galvanically separating the intermediate circuits by means of a switching device when the voltages in the intermediate circuits reaches a respective or a common predetermined threshold value $S_U$.

13. Method according to claim 12, wherein the respective or common threshold value $S_U$ is predetermined in relation to achieving a passive voltage level of the respective intermediate circuit, which threshold value is set in an equilibrium of the voltage conversions of the respective test channel during uncontrolled, invariable rectification itself.

14. Method according to claim 11, further comprising the steps of:

specifying a predetermined length of time length of time after completion of a switching process for galvanically coupling or separating intermediate circuits; and transferring the uncontrolled, invariable rectification to the phase-controlled, variably adjustable rectification by transferring the active power stages from the passive operating mode back to the active operating mode when the specified length of time has elapsed.

15. Method according to claim 11, further comprising the intermediate step of:

disconnecting output stages from an associated intermediate circuit, or disconnecting test load devices from an associated output stage; and galvanically coupling intermediate circuits of at least two test channels to form a common intermediate circuit or galvanically separating the intermediate circuits by means of a switching device when a supply of all test load devices has been interrupted.

* * * * *